United States Patent
Lin et al.

(10) Patent No.: US 12,470,438 B2
(45) Date of Patent: Nov. 11, 2025

(54) LOW VOLTAGE DIFFERENTIAL SIGNALING RECEIVER

(71) Applicant: NOVATEK Microelectronics Corp., Hsinchu (TW)

(72) Inventors: Ying-Cheng Lin, Taoyuan (TW); Che-Yi Lin, Hsinchu (TW); Chun-Po Huang, Tainan (TW)

(73) Assignee: NOVATEK Microelectronics Corp., Hsinchu (TW)

( * ) Notice: Subject to any disclaimer, the term of this patent is extended or adjusted under 35 U.S.C. 154(b) by 234 days.

(21) Appl. No.: 18/346,273

(22) Filed: Jul. 3, 2023

(65) Prior Publication Data
US 2025/0016031 A1    Jan. 9, 2025

(51) Int. Cl.
*H04L 25/02* (2006.01)
*H03F 3/45* (2006.01)

(52) U.S. Cl.
CPC ..... *H04L 25/0294* (2013.01); *H03F 3/45645* (2013.01); *H04L 25/0276* (2013.01)

(58) Field of Classification Search
CPC ............. H04L 25/0294; H04L 25/0276; H03F 3/45645; H03F 2203/45644; H03F 3/45183; H03F 3/4521; H03F 3/45219; H03F 3/4565; H03K 19/017509; H03K 5/2481; G06F 13/4072
See application file for complete search history.

(56) References Cited

U.S. PATENT DOCUMENTS

| | | | |
|---|---|---|---|
| 11,870,399 B2* | 1/2024 | Hong | ........................ H03F 3/19 |
| 2004/0174215 A1 | 9/2004 | Li et al. | |
| 2006/0066393 A1 | 3/2006 | Davis et al. | |
| 2009/0189882 A1 | 7/2009 | Huang et al. | |
| 2014/0375355 A1 | 12/2014 | Saito | |
| 2020/0313638 A1* | 10/2020 | Hong | .................. H03F 3/45183 |

* cited by examiner

*Primary Examiner* — Daniel D Chang
(74) *Attorney, Agent, or Firm* — CKC & Partners Co., LLC

(57) ABSTRACT

A low voltage differential signaling receiver includes a resistor load pair, an input stage, a current mode logic stage and a comparator circuit. The input stage includes a P-type transistor pair and a N-type transistor pair. The P-type transistor pair and the N-type transistor pair are configured to generate first differential output voltages on the resistor load pair according to differential input signals. The current mode logic stage is configured to enhance a gain of the first differential output voltages into second differential output voltages. The latch circuit is configured to generate third differential output voltages according to the second differential output voltages and latch the third differential output voltages. The comparator circuit is configured to compare the third differential output voltages and generate a single-ended output signal.

13 Claims, 6 Drawing Sheets

LOW VOLTAGE DIFFERENTIAL SIGNALING RECEIVER

BACKGROUND

Field of Invention

The disclosure relates to a signal receiver. More particularly, the disclosure relates to an input buffer of a low voltage differential signaling (LVDS) receiver.

Description of Related Art

Low Voltage Differential Signaling (LVDS) is a high-speed, low-power signaling standard used for point-to-point communication between electronic devices or between different components in one electronic device. Some LVDS receivers are commonly used in various applications, such as video displays, communication systems, and data acquisition systems.

SUMMARY

An embodiment of the disclosure provides a low voltage differential signaling receiver, which includes a resistor load pair, an input stage, a current mode logic stage and a comparator circuit. The input stage includes a P-type transistor pair and a N-type transistor pair. The P-type transistor pair is coupled to the resistor load pair, the P-type transistor pair is configured to generate first differential output voltages on the resistor load pair according to differential input signals. The N-type transistor pair is coupled to the resistor load pair. The N-type transistor pair is configured to generate the first differential output voltages on the resistor load pair according to the differential input signals. The current mode logic stage is coupled to the resistor load pair and the input stage. The current mode logic stage is configured to enhance a gain of the first differential output voltages into second differential output voltages. The latch circuit is coupled to the current mode logic stage. The latch circuit is configured to generate third differential output voltages according to the second differential output voltages and latch the third differential output voltages. The comparator circuit is coupled to the latch circuit. The comparator circuit is configured to compare the third differential output voltages and generate a single-ended output signal.

An embodiment of the disclosure provides a low voltage differential signaling receiver, which includes an input stage and a comparator circuit. The input stage includes a P-type transistor pair and a N-type transistor pair. The P-type transistor pair is coupled to the resistor load pair. The P-type transistor pair is configured to generate first differential output voltages according to differential input signals. The N-type transistor pair is coupled to the resistor load pair. The N-type transistor pair is configured to generate the first differential output voltages according to the differential input signals. The latch circuit is coupled to the input stage. The latch circuit is configured to latch the first differential output voltages. The comparator circuit is coupled to the input stage and the latch circuit. The comparator circuit is configured to compare the first differential output voltages and generate a single-ended output signal.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
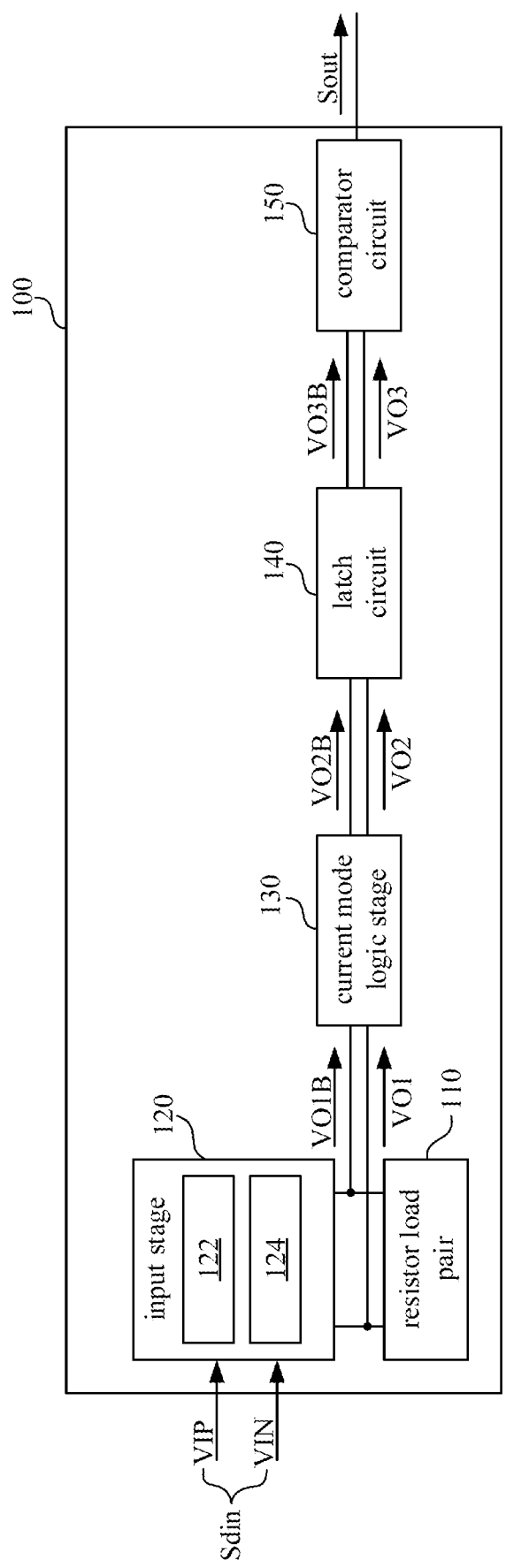
FIG. 1 is a block diagram illustrating a functional block diagram illustrating a low voltage differential signaling receiver 100 according to some embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1, which is a functional block diagram illustrating a low voltage differential signaling (LVDS) receiver 100 according to some embodiment of the disclosure.

One of challenges when designing the LVDS receiver 100 is achieving a rail-to-rail input voltage range for an input buffer of the LVDS receiver 100. The input buffer of the LVDS receiver is responsible for converting differential input signals into a single-ended output signal, which can be processed by the rest of the LVDS receiver 100. In order for the input buffer to operate correctly, it needs to be able to handle input signals that span the entire voltage range between the power supply rails.

However, achieving a rail-to-rail input voltage range can be difficult due to several factors. For example, the input buffer of the LVDS receiver 100 may be susceptible to common-mode noise or other interference that can limit the usable input voltage range. Embodiments of this disclosure provide a structure of the LVDS receiver 100, which is able to achieve the rail-to-rail input voltage range.

As shown in FIG. 1, the LVDS receiver 100 includes a resistor load pair 110, an input stage 120, a current mode logic stage 130, a latch circuit 140 and a comparator circuit 150.

As shown in FIG. 1, the input stage 120 is configured to receive the differential input signals Sdin (including a first input signal VIP and a second input signal VIN), and generate first differential output voltages (including a first output voltage VO1 and a first complementary output voltage VO1B) according to the differential input signals Sdin. In some embodiments, the first input signal VIP is regarded as a positive signal of the differential input signals Sdin and a second input signal VIN is regarded as a negative signal of the differential input signals Sdin.

For example, when a voltage level of the first input signal VIP is higher than a voltage level of the second input signal VIN, a voltage level of the first output voltage VO1 generated by the input stage 120 will be higher than a voltage level of the first complementary output voltage VO1B. On the other hand, when a voltage level of the first input signal VIP is lower than a voltage level of the second input signal VIN, the voltage level of the first output voltage VO1 generated by the input stage 120 will be lower than the voltage level of the first complementary output voltage VO1B.

As shown in FIG. 1, the input stage 120 includes a P-type transistor pair 122 and an N-type transistor pair 124. The P-type transistor pair 122 is coupled to the resistor load pair 110. The N-type transistor pair 124 is coupled to the resistor load pair 110. In some embodiments, the P-type transistor pair 122 and the N-type transistor pair 124 are both configured to generate the first differential output voltages (VO1, VO1B) on the resistor load pair 110 according to the differential input signals (VIP, VIN). The main difference is that the P-type transistor pair 122 and the N-type transistor pair 124 are able to operate in different voltage ranges of a common mode voltage of the differential input signals Sdin.

For example, when the common mode voltage of the differential input signals Sdin is relatively low (e.g., 0V to 1.1V), the P-type transistor pair 122 is configured to generate the first differential output voltages (VO1, VO1B) on the resistor load pair 110 according to the differential input signals (VIP, VIN), and the N-type transistor pair 124 is disabled by the differential input signals Sdin. When the common mode voltage of the differential input signals Sdin is relatively high (e.g., 3.3V to 5V), the N-type transistor pair 124 is configured to generate the first differential output voltages (VO1, VO1B) on the resistor load pair 110 according to the differential input signals (VIP, VIN), and the P-type transistor pair 122 is disabled by the differential input signals Sdin. When the common mode voltage of the differential input signals Sdin is intermediate (e.g., 1.1V to 3.3V), both of the P-type transistor pair 122 and the N-type transistor pair 124 are configured to generate the first differential output voltages (VO1, VO1B) on the resistor load pair 110 according to the differential input signals (VIP, VIN). Based on aforesaid configurations, the input stage 120 of the LVDS receiver 100 is able to cover a wide voltage range of the differential input signals Sdin, so as to achieve the rail-to-rail input voltage range.

Figure 2:
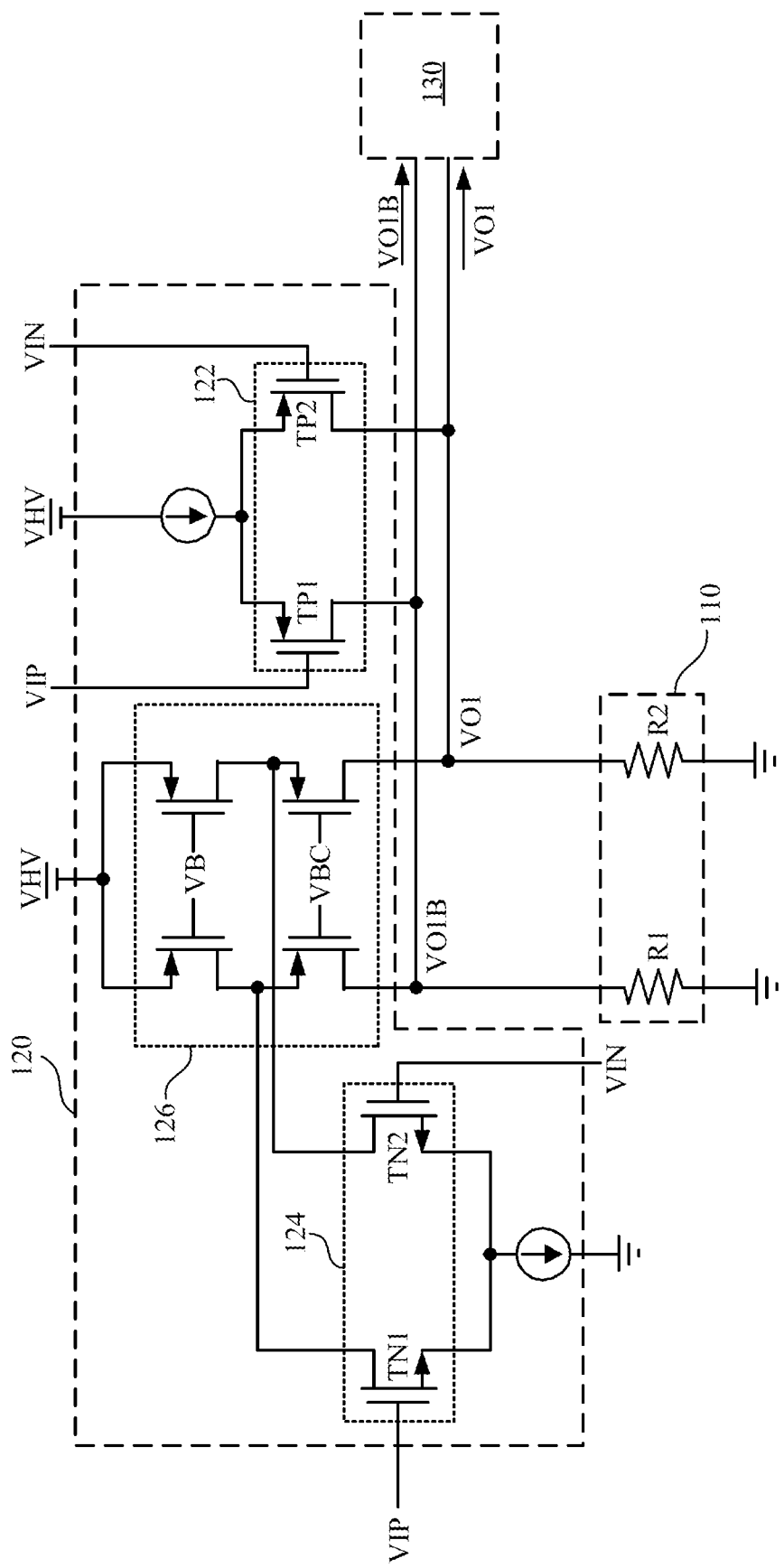
FIG. 2 is a schematic diagram illustrating internal structures of the resistor load pair and the input stage of the low voltage differential signaling receiver according to some embodiments of the disclosure.

Reference is further made to FIG. 2, which is a schematic diagram illustrating internal structures of the resistor load pair 110 and the input stage 120 of the LVDS receiver 100 according to some embodiments of the disclosure.

As shown in FIG. 2, in some embodiments, the resistor load pair 110 includes a first resistor R1 and a second resistor R2. The input stage 120 includes the P-type transistor pair 122, the N-type transistor pair 124 and a biasing circuit 126. The biasing circuit 126 is coupled between the N-type transistor pair 124 and the resistor load pair 110.

As shown in FIG. 2, the P-type transistor pair 122 includes a first PMOS transistor TP1 and a second PMOS transistor TP2. A first terminal of the first PMOS transistor TP1 is coupled to a first system power VHV. A second terminal of the first PMOS transistor TP1 is coupled to the first resistor R1. A control terminal of the first PMOS transistor TP1 is coupled to receive the first input signal VIP of the differential input signals Sdin.

A first terminal of the second PMOS transistor TP2 is coupled to the first system power VHV. A second terminal of the second PMOS transistor TP2 is coupled to the second resistor R2. A control terminal of the second PMOS transistor is coupled to receive a second input signal VIN of the differential input signals Sdin.

Because characteristics of the PMOS transistors, the first PMOS transistor TP1 and the second PMOS transistor TP2 have a relative low threshold voltage (compared to NMOS transistors), and the first PMOS transistor TP1 and the second PMOS transistor TP2 will be turned off (disabled) when their control terminals receive a high-voltage signal. The first PMOS transistor TP1 and the second PMOS transistor TP2 are suitable to generate the first differential output voltages (VO1, VO1B) when the common mode voltage of the differential input signals Sdin is relatively low (e.g., 0V to 3.3V).

As shown in FIG. 2, the input stage 120 includes the biasing circuit 126. The biasing circuit 126 is coupled between the first system power VHV and the resistor load pair 110. Transistors in the biasing circuit 126 are driven by bias voltages VB and VBC in a saturation mode. In other words, these transistors in the biasing circuit 126 are conducted by the bias voltages VB and VBC. In some embodiments, the biasing circuit 126 can be regarded as an isolation barrier to avoid signal interference between the P-type transistor pair 122 and the N-type transistor pair 124.

As shown in FIG. 2, in some embodiments, the N-type transistor pair 124 includes a first NMOS transistor TN1 and a second NMOS transistor TN2. A first terminal of the first NMOS transistor TN1 is coupled to a system ground. A second terminal of the first NMOS transistor TN1 is coupled through the biasing circuit 126 to the first resistor R1. A control terminal of the first NMOS transistor is coupled to receive the first input signal VIP of the differential input signals Sdin.

A first terminal of the second NMOS transistor TN2 is coupled to the system ground. A second terminal of the second NMOS transistor TN2 is coupled through the biasing circuit 126 to the second resistor R2. A control terminal of the second NMOS transistor TN2 is coupled to receive the second input signal VIN of the differential input signals Sdin.

Because characteristics of the NMOS transistors, the first NMOS transistor TN1 and the second NMOS transistor TN2 have a relative high threshold voltage (compared to PMOS transistors), and the first NMOS transistor TN1 and the second NMOS transistor TN2 will be turned off (disabled) when their control terminals receive a low-voltage signal. The first NMOS transistor TN1 and the second NMOS transistor TN2 are suitable to generate the first differential output voltages (VO1, VO1B) when the common mode voltage of the differential input signals Sdin is relatively high (e.g., 1.1V to 5V).

As discussed above in FIG. 1 and FIG. 2, the input stage 120 is configured to form the first differential output voltages (VO1, VO1B) on the resistor load pair 110. Because of the resistor load pair 110, the first differential output voltages (VO1, VO1B) are able to react quickly in response to variation of the differential input signals Sdin, compared to a low reaction time on a capacitive load. In some embodiments, a signal gain of the first differential output voltages (VO1, VO1B) formed on the resistor load pair 110 will be smaller (compared to a higher signal gain on a capacitive load), and it is not easy for a comparator to extract a voltage difference between the first differential output voltages (VO1, VO1B).

In this case, as shown in FIG. 1, the LVDS receiver 100 includes a current mode logic stage 130 for enhancing a gain of the first differential output voltages (VO1, VO1B) and correspondingly generating the second differential output voltages (including a second output voltage VO2 and a second complementary output voltage VO2B). The current mode logic stage 130 is coupled to the resistor load pair 110 and the input stage 120.

As shown in FIG. 1, the latch circuit 140 is coupled to the current mode logic stage 130. The latch circuit 140 is configured to generate third differential output voltages (including a third output voltage VO3 and a third complementary output voltage VO3B) according to the second differential output voltages (VO2, VO2B) and latch the third differential output voltages (VO3, VO3B). The comparator circuit 150 is coupled to the latch circuit 140, the comparator circuit 150 is configured to compare the third differential output voltages (VO3, VO3B) and generate the single-ended output signal Sout.

Figure 3:
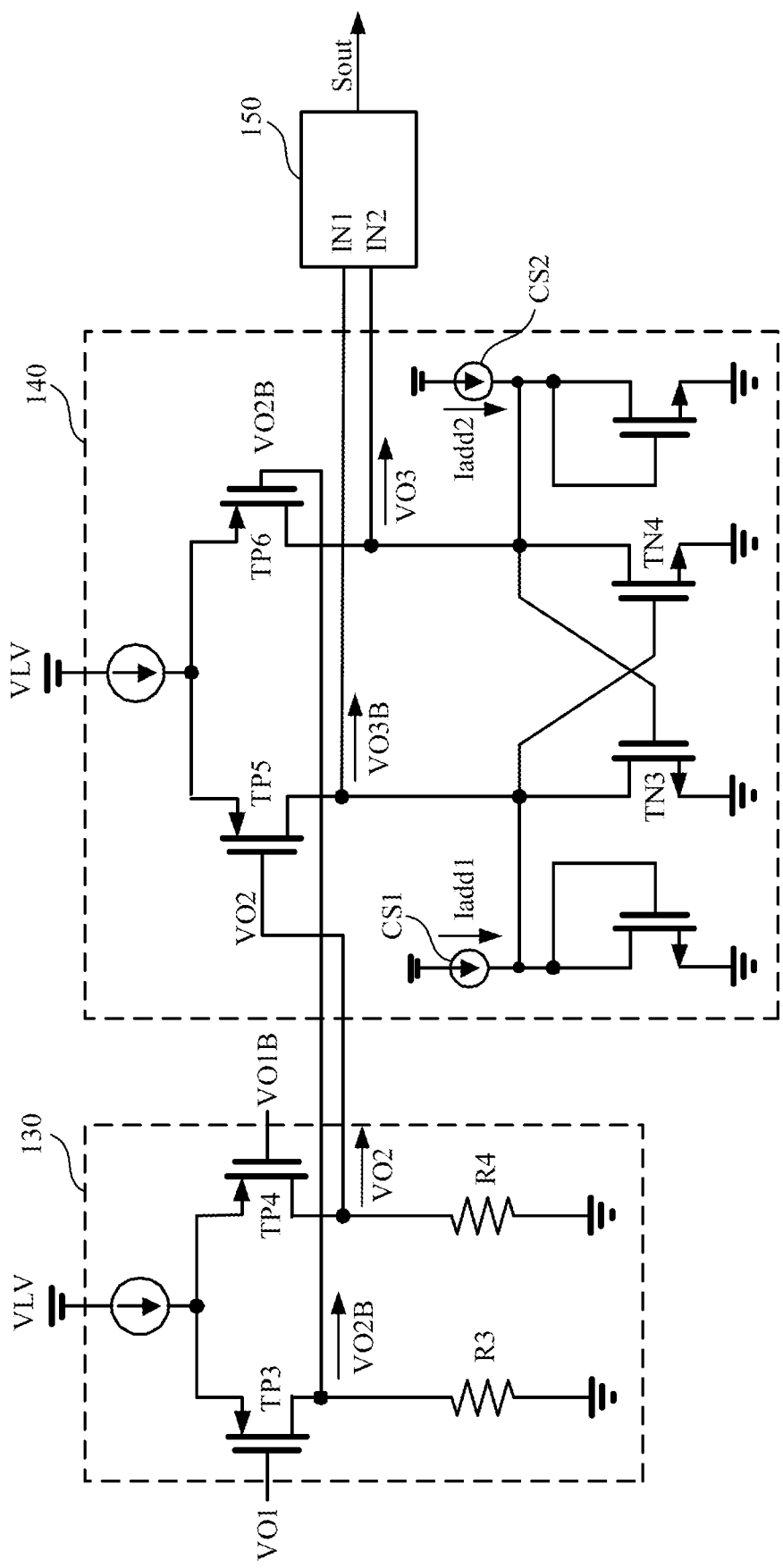
FIG. 3 is a schematic diagram illustrating internal structures of the current mode logic stage and the latch circuit of the low voltage differential signaling receiver according to some embodiments of the disclosure.

Reference is further made to FIG. 3, which is a schematic diagram illustrating internal structures of the current mode logic stage 130 and the latch circuit 140 of the LVDS receiver 100 according to some embodiments of the disclosure.

As shown in FIG. 3, the current mode logic stage 130 includes a third resistor R3, a fourth resistor R4, a third PMOS transistor TP3 and a fourth PMOS transistor TP4. A first terminal of the third PMOS transistor TP3 is coupled to a second system power VLV. A second terminal of the third PMOS transistor TP3 is coupled to the third resistor R3. A control terminal of the third PMOS transistor TP3 is coupled to the second resistor R2 and receive the first output voltage VO1 of the first differential output voltages.

A first terminal of the fourth PMOS transistor TP4 is coupled to the second system power VLV. A second terminal of the fourth PMOS transistor TP4 is coupled to the fourth resistor R4. A control terminal of the fourth PMOS transistor TP4 is coupled to the first resistor R1 and receive the first complementary output voltage VO1B of the first differential output voltages.

As shown in FIG. 3, the latch circuit 140 includes a fifth PMOS transistor TP5, a sixth PMOS transistor TP6, a third NMOS transistor TN3 and a fourth NMOS transistor TN4. A first terminal of the fifth PMOS transistor TP5 is coupled to the second system power VLV. A second terminal of the fifth PMOS transistor TP5 is coupled to a first input terminal IN1 of the comparator circuit 150. A control terminal of the fifth PMOS transistor TP5 is coupled to receive a second output voltage VO2 of the second differential output voltages generated by the current mode logic stage 130.

A first terminal of the sixth PMOS transistor TP6 is coupled to the second system power VLV. A second terminal of the sixth PMOS transistor TP6 is coupled to a second input terminal IN2 of the comparator circuit 150. A control terminal of the sixth PMOS transistor TP6 is coupled to receive a second complementary output voltage VO2B of the second differential output voltages generated by the current mode logic stage 130.

A first terminal of the third NMOS transistor TN3 is coupled to the system ground. A second terminal of the third NMOS transistor TN3 is coupled to the second terminal of the fifth PMOS transistor TP5 and the first input terminal IN1 of the comparator circuit 150. A control terminal of the third NMOS transistor TN3 is coupled to the second terminal of the sixth PMOS transistor TP6 and the second input terminal IN2 of the comparator circuit 150.

A first terminal of the fourth NMOS transistor TN4 is coupled to the system ground. A second terminal of the fourth NMOS transistor TN4 is coupled to the second terminal of the sixth PMOS transistor TP6 and the second input terminal IN2 of the comparator circuit 150. A control terminal of the fourth NMOS transistor TN4 is coupled to the second terminal of the fifth PMOS transistor TP5 and the first input terminal IN1 of the comparator circuit 150. The latch circuit 140 is configured to generate third differential output voltages (VO3, VO3B) according to the second differential output voltages (VO2, VO2B) and latch the third differential output voltages (VO3, VO3B). The comparator circuit 150 is configured to compare the third differential output voltages (VO3, VO3B) and generate the single-ended output signal Sout.

The latch circuit 140 is configured to latch a third output voltage VO3 of the third differential output voltages at the second terminal of the sixth PMOS transistor TP6 and the second terminal of the fourth NMOS transistor TN4. At the same time, the latch circuit 140 is configured to latch a third complementary output voltage VO3B of the third differential output voltages at the second terminal of the fifth PMOS transistor TP5 and the second terminal of the third NMOS transistor TN3.

For example, when the third output voltage VO3>the third complementary output voltage VO3B, the single-ended output signal Sout generated by comparator circuit 150 can have a logic "1". On the other hand, when the third output voltage VO3<the third complementary output voltage VO3B, the single-ended output signal Sout generated by comparator circuit 150 can have a logic "0". In some embodiments, the single-ended output signal can be a digital signal reflecting the differential input signals (VIN, VIP).

It is noticed that the first system power VHV shown in FIG. 2 and the second system power VLV shown in FIG. 3 are both system power supplies (e.g., VDD) for driving circuitry components. In some embodiments, a voltage level of the second system power VLV is lower than a voltage level of the first system power VHV. By utilizing a lower second system power VLV, a power consumption of circuitry components driven by the second system power VLV can be reduced. In this case, the input stage 120 (driven by the first system power VHV) can achieve a wider input voltage range; in the meantime, power consumptions on the current mode logic stage 130 and the latch circuit 140 (driven by the second system power VLV) can be reduced.

As shown in FIG. 3, the latch circuit 140 further includes a first current source CS1 and a second current source CS2. The first current source CS1 is coupled to the second terminal of the third NMOS transistor TN3. The first current source CS1 is configured to provide a first supplemental current Iadd1 to the second terminal of the third NMOS transistor TN3. The second current source CS2 is coupled to the second terminal of the fourth NMOS transistor TN4. The second current source CS2 is configured to provide a second supplemental current Iadd2 to the second terminal of the third NMOS transistor TN4. The first current source CS1 and the second current source CS2 are beneficial to keep data latched in the latch circuit 140. In some cases the data latched in the latch circuit 140 might be affected (or lost) over time due to leakage currents over the third NMOS transistor TN3 and the fourth NMOS transistor TN4. In the embodiments shown in FIG. 3, the first supplemental current Iadd1 and the second supplemental current Iadd2 are able to compensate the leakage currents and secure the data latched in the latch circuit 140.

Figure 4:
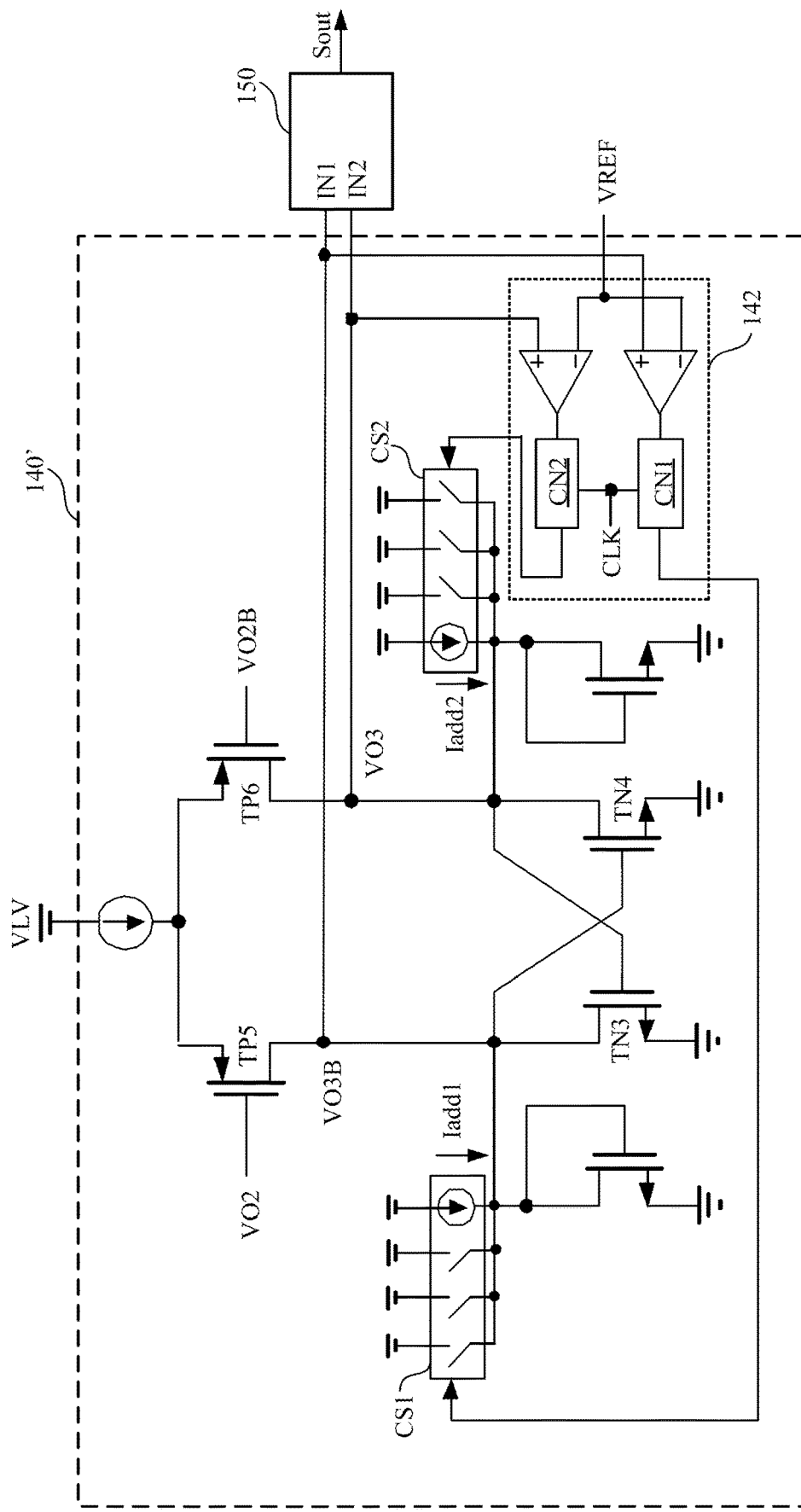
FIG. 4 is a schematic diagram illustrating internal structures of the latch circuit according to another embodiment of the disclosure.

In some other embodiments, the first supplemental current Iadd1 and the second supplemental current Iadd2 can be dynamically adjusted according to the third differential output voltages (VO3 and VO3B). Reference is further made to FIG. 4. FIG. 4 is a schematic diagram illustrating internal structures of the latch circuit 140' according to another embodiment of the disclosure.

In some embodiments, the latch circuit 140' shown in FIG. 4 can be utilized in the low voltage differential signaling receiver 100 shown in FIG. 1 to FIG. 3. Compared to embodiments of the latch circuit 140 shown in FIG. 3, the latch circuit 140' further includes a feedback control circuit 142. The first current source CS1 and the second current source CS2 shown in FIG. 4 are dynamically adjustable to provide different amplitudes of the first supplemental current ladd1 and the second supplemental current ladd2. The feedback control circuit 142 is configured to sample the third output voltage VO3 and the third complementary output voltage VO3B and compare them with a reference voltage VREF. Based on a comparison result between the third complementary output voltage VO3B and the reference voltage VREF, a count value of a first counter CN1 driven by a clock signal CLK is increased or decreased accordingly. The count value of the first counter CN1 is transmitted to the first current source CS1 for adjusting the current amplitude of the first supplemental current ladd1 provided by the first current source CS1. Based on a comparison result between the third output voltage VO3 and the reference voltage VREF, a count value of a second counter CN2 driven by the clock signal CLK is increased or decreased accordingly. The count value of the second counter CN2 is transmitted to the second current source CS2 for adjusting the current amplitude of the second supplemental current ladd2 provided by the second current source CS2.

The feedback control circuit 142 is configured to adjust current amplitudes of the first supplemental current ladd1 and the second supplemental current ladd2 according to the third complementary output voltage VO3B of the third differential output voltages and the third output voltage VO3 of the third differential output voltages.

Based on aforesaid embodiments, the low voltage differential signaling receiver 100 is able to achieve the rail-to-rail input voltage range. In addition, the resistor load pair 110 is able to provide a fast response time (compared to a capacitive load or an inductance load) to the differential input signals. The current mode logic stage 130 is able to enhance the gain of the differential output voltages. The current mode logic stage 130 and the latch circuit 140/140' can be operated in a relatively low system power VLV to reduce an overall power consumption.

Figure 5:
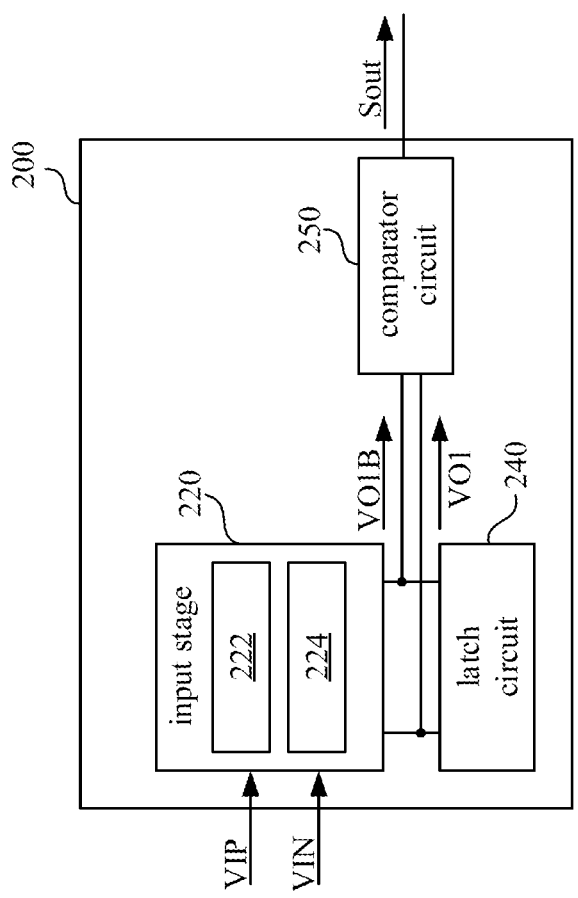
FIG. 5 is a functional block diagram illustrating a low voltage differential signaling receiver according to another embodiment of the disclosure.

It is noticed that this disclosure is not limited to use the resistor load. In some embodiments, the resistor load pair can be replaced by latch-type load to simply circuit structures of the low voltage differential signaling receiver. Reference is made to FIG. 5, which is a functional block diagram illustrating a low voltage differential signaling receiver 200 according to another embodiment of the disclosure.

As shown in FIG. 5, the LVDS receiver 200 includes an input stage 220, a latch circuit 240 and a comparator circuit 250. As shown in FIG. 5, the input stage 220 includes a P-type transistor pair 222 and a N-type transistor pair 224. The P-type transistor pair 222 is configured to generate first differential output voltages (VO1, VO1B) according to differential input signals (VIN, VIP). The N-type transistor pair 224 is configured to generate the first differential output voltages (VO1, VO1B) according to the differential input signals (VIN, VIP). The latch circuit 240 is coupled to the input stage 220. The latch circuit is configured to latch the first differential output voltages (VO1, VO1B). The comparator circuit 250 is coupled to the input stage 220 and the latch circuit 240. The comparator circuit 250 is configured to compare the first differential output voltages (VO1, VO1B) and generate a single-ended output signal Sout.

Figure 6:
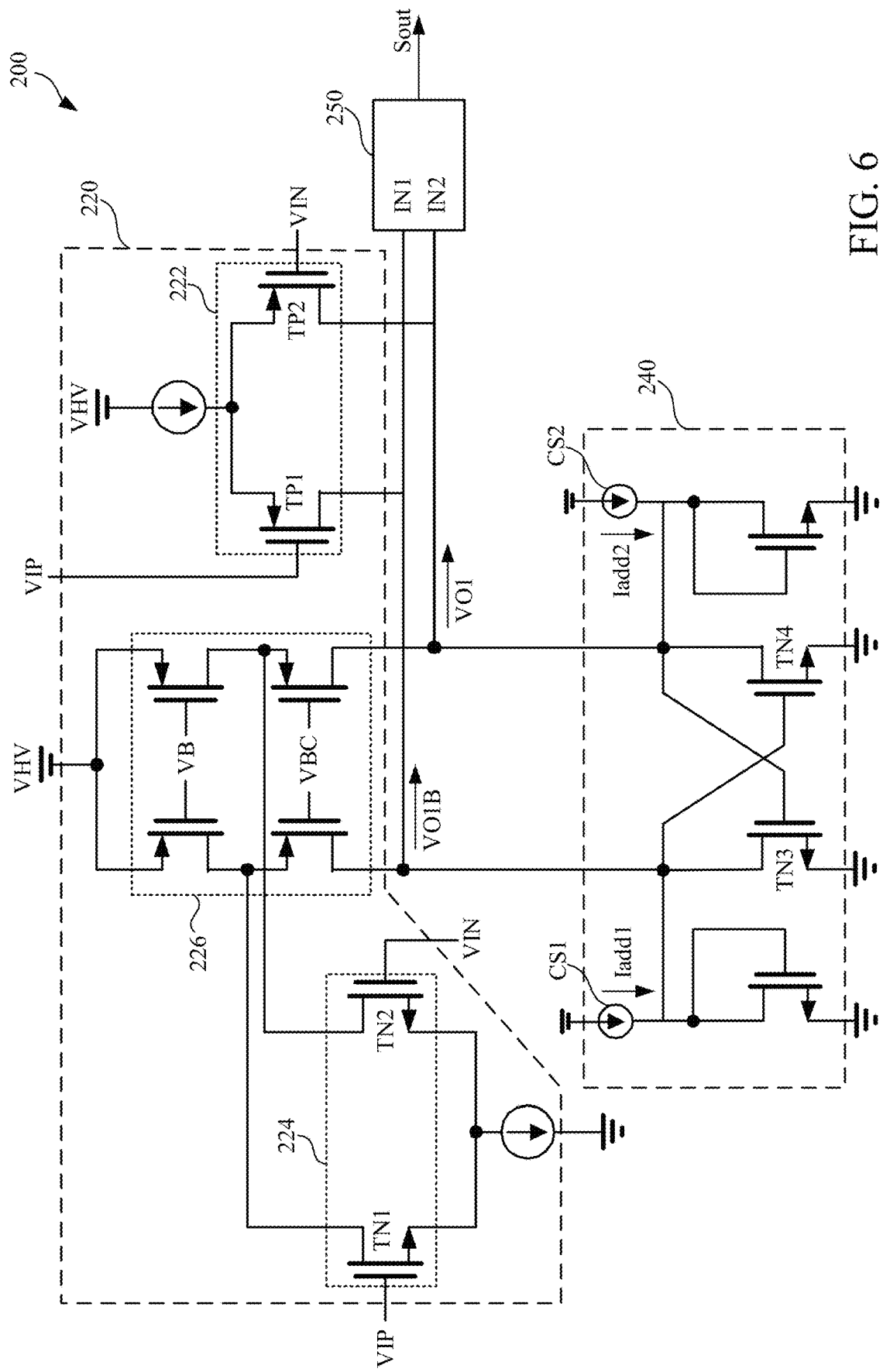
FIG. 6 is a schematic diagram illustrating internal structures of the input stage and the latch circuit of the low voltage differential signaling receiver according to some embodiments of the disclosure.

Reference is further made to FIG. 6, which is a schematic diagram illustrating internal structures of the input stage 220 and the latch circuit 240 of the LVDS receiver 200 according to some embodiments of the disclosure.

Compared to the LVDS receiver 100 shown in FIG. 1 and FIG. 2, the LVDS receiver 200 do not include a resistor-type load, and the latch circuit 240 is directly coupled with the input stage 220 as shown in FIG. 6. In the embodiments show in FIG. 6, the latch circuit 240 is utilized as a load in view of the input stage 220 to generate the first differential output voltages (VO1, VO1B) and latch circuit 240 is also utilized as a latch to keep the first differential output voltages (VO1, VO1B).

As shown in FIG. 6, the P-type transistor pair 222 includes a first PMOS transistor TP1 and a second PMOS transistor TP2. A first terminal of the first PMOS transistor TP1 is coupled to a first system power VHV. A second terminal of the first PMOS transistor TP1 is coupled to the latch circuit 240. A control terminal of the first PMOS transistor TP1 is coupled to receive a first input signal VIP of the differential input signals Sdin.

A first terminal of the second PMOS transistor TP2 is coupled to the first system power VHV. A second terminal of the second PMOS transistor TP2 is coupled to the latch circuit 240. A control terminal of the second PMOS transistor TP2 is coupled to receive a second input signal VIN of the differential input signals Sdin.

As shown in FIG. 6, the input stage 220 further includes a biasing circuit 226. The biasing circuit 226 is coupled between the first system power VHV and the latch circuit 240.

Transistors in the biasing circuit 226 are driven by bias voltages VB and VBC in a saturation mode. In other words, these transistors in the biasing circuit 226 are conducted by the bias voltages VB and VBC. In some embodiments, the biasing circuit 226 can be regarded as an isolation barrier to avoid signal interference between the P-type transistor pair 222 and the N-type transistor pair 224.

As shown in FIG. 6, the N-type transistor pair 224 includes a first NMOS transistor TN1 and a second NMOS transistor TN2. A first terminal of the first NMOS transistor TN1 is coupled to a system ground. A second terminal of the first NMOS transistor TN1 is coupled through the biasing circuit 226 to the latch circuit 240. T control terminal of the first NMOS transistor TN1 is coupled to receive the first input signal VIP of the differential input signals Sdin.

As shown in FIG. 6, a first terminal of the second NMOS transistor TN2 is coupled to the system ground. A second terminal of the second NMOS transistor TN2 is coupled through the biasing circuit 226 to the latch circuit 240. A control terminal of the second NMOS transistor TN2 is coupled to receive the second input signal of VIN the differential input signals Sdin.

The latch circuit 240 is configured to latch differential first output voltages (VO1, VO1B). The comparator circuit 250 is coupled to the latch circuit 240, the comparator circuit 250 is configured to compare the first output voltages (VO1, VO1B) and generate the single-ended output signal Sout.

As shown in FIG. 6, the latch circuit 240 includes a third NMOS transistor TN3 and a fourth NMOS transistor TN4. A first terminal of the third NMOS transistor TN3 is coupled to the system ground. A second terminal of the third NMOS transistor TN3 is coupled to the second terminal of the first PMOS transistor TP1 and a first input terminal IN1 of the comparator circuit 250. A control terminal of the third NMOS transistor TN3 is coupled to the second terminal of the second PMOS transistor TP2 and a second input terminal IN2 of the comparator circuit 250.

As shown in FIG. 6, a first terminal of the fourth NMOS transistor TN4 is coupled to the system ground. A second terminal of the fourth NMOS transistor TN4 is coupled to the second terminal of the second PMOS transistor TP2 and the second input terminal IN2 of the comparator circuit 250. A control terminal of the fourth NMOS transistor TN4 is coupled to the second terminal of the first PMOS transistor TP1 and the first input terminal IN1 of the comparator circuit 250.

The latch circuit 240 is configured to latch a first output voltage VO1 of the first differential output voltages at the second terminal of the fourth NMOS transistor TN4. In addition, the latch circuit 240 is also configured to latch a first complementary output voltage VO1B of the first differential output voltages at the second terminal of the third NMOS transistor TN3.

As shown in FIG. 6, the latch circuit 240 further includes a first current source CS1 and a second current source CS2. The first current source CS1 is coupled to the second terminal of the third NMOS transistor TN3. The first current source CS1 is configured to provide a first supplemental current Iadd1 to the second terminal of the third NMOS transistor TN3. The second current source CS2 is coupled to the second terminal of the fourth NMOS transistor TN4. The second current source CS2 is configured to provide a second supplemental current Iadd2 to the second terminal of the fourth NMOS transistor TN4.

In some other embodiments, the first supplemental current Iadd1 and the second supplemental current Iadd2 can be dynamically adjusted according to the first differential output voltages (VO1 and VO1B). In this case, the latch circuit 240 further includes a feedback control circuit (not shown in FIG. 6) for dynamically adjusting current amplitudes of the first supplemental current Iadd1 and the second supplemental current Iadd2. The structure of the feedback control circuit has been discussed in embodiments of the latch circuit 140' shown in FIG. 4, and not to be repeated here again.

In some embodiments, the P-type transistor pair 222 and the N-type transistor pair 224 are both configured to generate the first differential output voltages (VO1, VO1B) according to the differential input signals (VIP, VIN). The main difference is that the P-type transistor pair 222 and the N-type transistor pair 224 are able to operate in different voltage ranges of a common mode voltage of the differential input signals Sdin.

For example, when the common mode voltage of the differential input signals Sdin is relatively low (e.g., 0V to 1.1V), the P-type transistor pair 222 is configured to generate the first differential output voltages (VO1, VO1B) according to the differential input signals (VIP, VIN), and the N-type transistor pair 224 is disabled by the differential input signals Sdin. When the common mode voltage of the differential input signals Sdin is relatively high (e.g., 3.3V to 5V), the N-type transistor pair 224 is configured to generate the first differential output voltages (VO1, VO1B) according to the differential input signals (VIP, VIN), and the P-type transistor pair 222 is disabled by the differential input signals Sdin. When the common mode voltage of the differential input signals Sdin is intermediate (e.g., 1.1V to 3.3V), both of the P-type transistor pair 222 and the N-type transistor pair 224 are configured to generate the first differential output voltages (VO1, VO1B) according to the differential input signals (VIP, VIN). Based on aforesaid configurations, the input stage 220 of the LVDS receiver 200 is able to cover a wide voltage range of the differential input signals Sdin, so as to achieve the rail-to-rail input voltage range.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A low voltage differential signaling receiver, comprising:
   a resistor load pair;
   an input stage, comprising:
      a P-type transistor pair, coupled to the resistor load pair, the P-type transistor pair being configured to generate first differential output voltages on the resistor load pair according to differential input signals;
      a N-type transistor pair, coupled to the resistor load pair, the N-type transistor pair being configured to generate the first differential output voltages on the resistor load pair according to the differential input signals;
   a current mode logic stage, coupled to the resistor load pair and the input stage, the current mode logic stage being configured to enhance a gain of the first differential output voltages into second differential output voltages;
   a latch circuit, coupled to the current mode logic stage, the latch circuit being configured to generate third differential output voltages according to the second differential output voltages and latch the third differential output voltages; and
   a comparator circuit, coupled to the latch circuit, the comparator circuit being configured to compare the third differential output voltages and generate a single-ended output signal.

2. The low voltage differential signaling receiver as claimed in claim 1, wherein the resistor load pair comprises a first resistor and a second resistor, the P-type transistor pair comprises:
   a first PMOS transistor, a first terminal of the first PMOS transistor being coupled to a first system power, a second terminal of the first PMOS transistor being coupled to the first resistor, a control terminal of the first PMOS transistor being coupled to receive a first input signal of the differential input signals; and
   a second PMOS transistor, a first terminal of the second PMOS transistor being coupled to the first system power, a second terminal of the second PMOS transistor being coupled to the second resistor, a control terminal of the second PMOS transistor being coupled to receive a second input signal of the differential input signals.

3. The low voltage differential signaling receiver as claimed in claim 2, wherein the input stage further comprises a biasing circuit, the biasing circuit is coupled between the first system power and the resistor load pair.

4. The low voltage differential signaling receiver as claimed in claim 3, wherein the N-type transistor pair comprises:
a first NMOS transistor, a first terminal of the first NMOS transistor being coupled to a system ground, a second terminal of the first NMOS transistor being coupled through the biasing circuit to the first resistor, a control terminal of the first NMOS transistor being coupled to receive the first input signal of the differential input signals; and
a second NMOS transistor, a first terminal of the second NMOS transistor being coupled to the system ground, a second terminal of the second NMOS transistor being coupled through the biasing circuit to the second resistor, a control terminal of the second NMOS transistor being coupled to receive the second input signal of the differential input signals.

5. The low voltage differential signaling receiver as claimed in claim 2, wherein the current mode logic stage comprises:
a third resistor;
a fourth resistor;
a third PMOS transistor, a first terminal of the third PMOS transistor being coupled to a second system power, a second terminal of the third PMOS transistor being coupled to the third resistor, a control terminal of the third PMOS transistor being coupled to the resistor load pair and receive one of the first differential output voltages; and
a fourth PMOS transistor, a first terminal of the fourth PMOS transistor being coupled to the second system power, a second terminal of the fourth PMOS transistor being coupled to the fourth resistor, a control terminal of the fourth PMOS transistor being coupled to the resistor load pair and receive another one of the first differential output voltages.

6. The low voltage differential signaling receiver as claimed in claim 5, wherein a voltage level of the second system power is lower than a voltage level of the first system power.

7. The low voltage differential signaling receiver as claimed in claim 1, wherein the latch circuit comprises:
a fifth PMOS transistor, a first terminal of the fifth PMOS transistor being coupled to a second system power, a second terminal of the fifth PMOS transistor being coupled to a first input terminal of the comparator circuit, a control terminal of the fifth PMOS transistor being coupled to receive one of the second differential output voltages;
a sixth PMOS transistor, a first terminal of the sixth PMOS transistor being coupled to the second system power, a second terminal of the sixth PMOS transistor being coupled to a second input terminal of the comparator circuit, a control terminal of the sixth PMOS transistor being coupled to receive another one of the second differential output voltages;
a third NMOS transistor, a first terminal of the third NMOS transistor being coupled to a system ground, a second terminal of the third NMOS transistor being coupled to the second terminal of the fifth PMOS transistor and the first input terminal of the comparator circuit, a control terminal of the third NMOS transistor being coupled to the second terminal of the sixth PMOS transistor and the second input terminal of the comparator circuit; and
a fourth NMOS transistor, a first terminal of the fourth NMOS transistor being coupled to the system ground, a second terminal of the fourth NMOS transistor being coupled to the second terminal of the sixth PMOS transistor and the second input terminal of the comparator circuit, a control terminal of the fourth NMOS transistor being coupled to the second terminal of the fifth PMOS transistor and the first input terminal of the comparator circuit.

8. The low voltage differential signaling receiver as claimed in claim 7, wherein the latch circuit is configured to latch an output voltage of the third differential output voltages at the second terminal of the sixth PMOS transistor and the second terminal of the fourth NMOS transistor, and the latch circuit is configured to latch a complementary output voltage of the third differential output voltages at the second terminal of the fifth PMOS transistor and the second terminal of the third NMOS transistor.

9. The low voltage differential signaling receiver as claimed in claim 8, wherein the latch circuit further comprises:
a first current source, coupled to the second terminal of the third NMOS transistor, the first current source being configured to provide a first supplemental current to the second terminal of the third NMOS transistor; and
a second current source, coupled to the second terminal of the fourth NMOS transistor, the second current source being configured to provide a second supplemental current to the second terminal of the fourth NMOS transistor.

10. The low voltage differential signaling receiver as claimed in claim 9, wherein the latch circuit further comprises:
a feedback control circuit, coupled with the first current source and the second current source, the feedback control circuit being configured to adjust current amplitudes of the first supplemental current and the second supplemental current according to the complementary output voltage of the third differential output voltages and the output voltage of the third differential output voltages.

11. The low voltage differential signaling receiver as claimed in claim 1, wherein,
in response to a common mode voltage of the differential input signals is in a first voltage range, the P-type transistor pair is configured to generate the first differential output voltages, the N-type transistor pair is disabled by the differential input signals, and
in response to the common mode voltage of the differential input signals is in a second voltage range, the N-type transistor pair is configured to generate the first differential output voltages, the P-type transistor pair is disabled by the differential input signals.

12. The low voltage differential signaling receiver as claimed in claim 11, wherein the first voltage range is lower than the second voltage range.

13. The low voltage differential signaling receiver as claimed in claim 11, wherein, in response to the common mode voltage of the differential input signals is in a third voltage range, the P-type transistor pair and the N-type transistor pair are configured to generate the first differential output voltages,
wherein the third voltage range is between the first voltage range and the second voltage range.

\* \* \* \* \*